(12) United States Patent
Lin

(10) Patent No.: US 10,503,337 B2
(45) Date of Patent: Dec. 10, 2019

(54) TOUCH DISPLAY DEVICE

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventor: Chien-Hung Lin, Hsinchu (TW)

(73) Assignees: Interface Technology (ChengDu) Co., Ltd., Chengdu (CN); INTERFACE OPTOELECTRONICS (SHENZHEN) CO., LTD., Chengdu (CN); GENERAL INTERFACE SOLUTION LIMITED, Zhunan (TW)

( * ) Notice: Subject to any disclaimer, the term of this patent is extended or adjusted under 35 U.S.C. 154(b) by 0 days.

(21) Appl. No.: 16/021,268

(22) Filed: Jun. 28, 2018

(65) Prior Publication Data

US 2019/0286259 A1    Sep. 19, 2019

(30) Foreign Application Priority Data

Mar. 14, 2018   (CN) .......................... 2018 1 0209340

(51) Int. Cl.
*G06F 3/044*   (2006.01)
*H01L 27/32*   (2006.01)
*H01L 51/52*   (2006.01)

(52) U.S. Cl.
CPC ............ *G06F 3/044* (2013.01); *H01L 27/323* (2013.01); *H01L 27/3244* (2013.01); *H01L 51/5237* (2013.01); *H01L 51/5281* (2013.01)

(58) Field of Classification Search
CPC ... G06F 3/044; H01L 27/323; H01L 27/3244; H01L 51/5237; H01L 51/5281
See application file for complete search history.

(56) References Cited

U.S. PATENT DOCUMENTS

2018/0321561 A1* 11/2018 Huang .............. G02F 1/136204

* cited by examiner

*Primary Examiner* — Charles V Hicks
(74) *Attorney, Agent, or Firm* — ScienBiziP, P.C.

(57) ABSTRACT

A touch display device includes a display panel, a covering layer on the display panel and configured for covering the display panel, a touch sensing layer on a side of covering layer away from the display panel, and a polarizer on a side of covering layer away from the display panel. The touch sensing layer includes a first touch electrode layer and a second touch electrode layer electrically insulated from the first touch electrode layer. The first touch electrode layer is on and in direct contact with the polarizer; the second touch electrode layer is on and in direct contact with the covering layer.

10 Claims, 4 Drawing Sheets

TOUCH DISPLAY DEVICE

FIELD

The subject matter herein generally relates to a touch display device.

BACKGROUND

A capacitive touch display device can include a capacitive touch panel. A conventional mutual capacitive touch panel generally includes a substrate, and a touch driving electrode pattern (TX pattern) and the touch sensing electrode pattern (RX pattern) on the substrate. The touch driving electrode pattern and the touch sensing electrode pattern are formed at different layers, thus the touch panel has an increased thickness. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
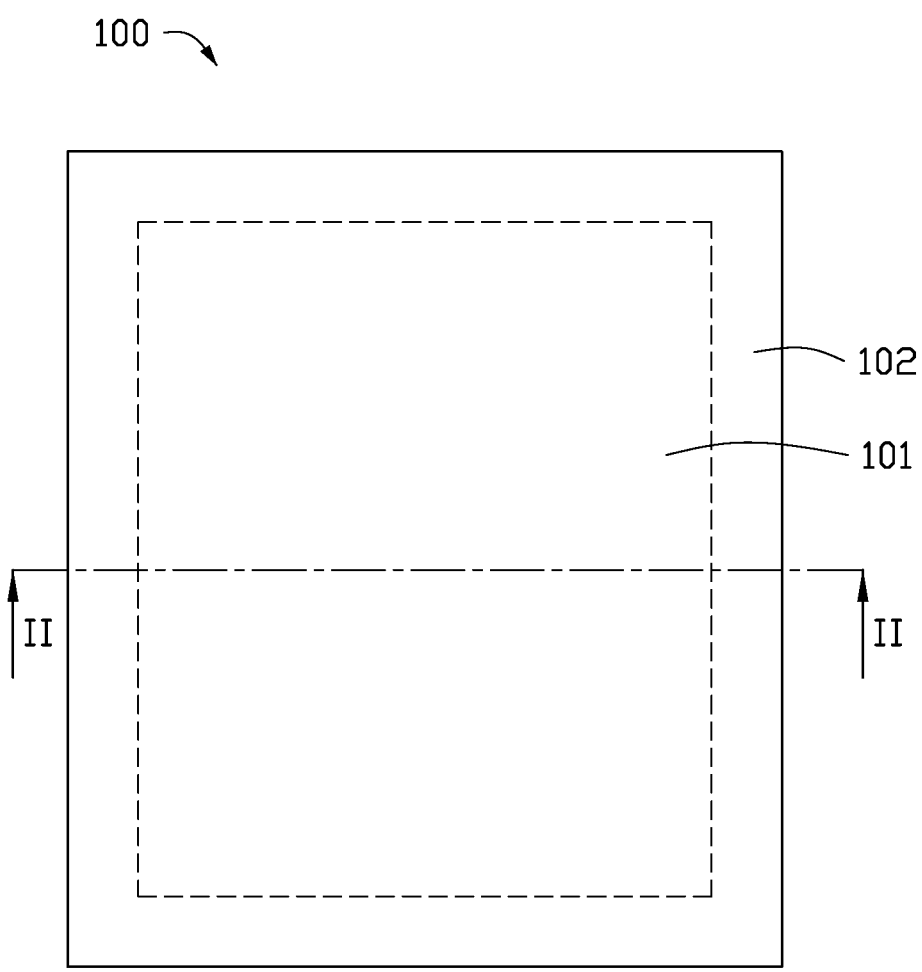
FIG. 1 is a plan view of a touch display device according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

First Embodiment

Figure 2:
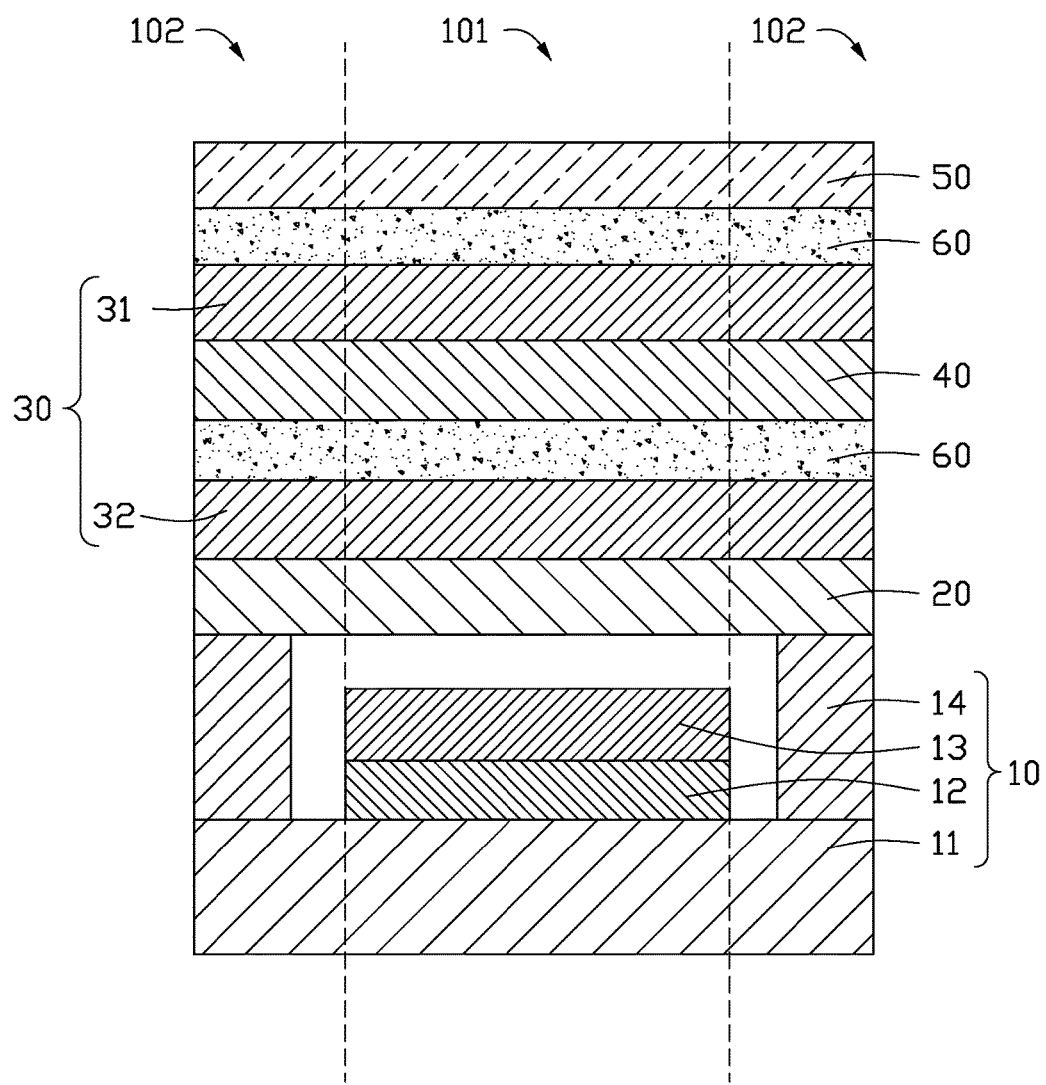
FIG. 2 is a cross-sectional view of the touch display device of FIG. 1 taken along line II-II.

FIG. 1 and FIG. 2 illustrate a touch display device 100 according to a first embodiment of the present disclosure. As shown in FIG. 1, the touch display device 100 defines a display area 101 and a non-display area 102 surrounding the display area 101.

As shown in FIG. 2, the touch display device 100 includes a display panel 10, a covering layer 20 located on the display panel 10 for covering the display panel 10, and a touch sensing layer 30 and a polarizer 40 located on the covering layer 20. The touch sensing layer 30 includes a first touch electrode layer 31 and a second touch electrode layer 32. The first touch electrode layer 31 is directly formed and grown on the polarizer 40 and the polarizer 40 is used as a growth substrate for the first touch electrode layer 31. The second touch electrode layer 32 is directly formed on and grown on the covering layer 20, and the covering layer 20 is used as a growth substrate for the second touch electrode layer 32.

In the present embodiment, the polarizer 40 is used as a growth substrate for the first touch electrode layer 31, and the covering layer 20 is used as a growth substrate for the second touch electrode layer 32, thus the touch display device 100 has a reduced thickness compared with a conventional touch display device.

In the present embodiment, the first touch electrode layer 31 includes a plurality of patterned first electrodes (not shown), and the second touch electrode layer 32 includes a plurality of patterned second electrodes (not shown). The first electrodes and the second electrodes can determine a touch position.

It can be understood that the first electrodes can be touch driving electrodes, and the second electrodes can be touch sensing electrodes. Alternatively, the first electrodes can be touch sensing electrodes, and the second electrodes can be touch driving electrodes. In the present embodiment, the first electrodes and the second electrodes form a mutual-capacitive touch sensing structure. When a touch event occurs, coupling capacitances between the first electrodes and the second electrodes in the touch areas vary, resulting in variations in signals (such as voltage values), and then the coordinates of touch position can be calculated.

Specifically, each first electrode and each second electrode may have a rhombic shape. The first electrodes are arranged in a plurality of rows each in a first direction (not shown) and in a plurality of columns each in a second direction (not shown). The first electrodes in a same row are sequentially electrically coupled to form a first electrode string. The first electrodes in different rows are electrically insulated from each other. The first direction intersects the second direction. The second electrodes are arranged in a plurality of rows each in the first direction (not shown) and in a plurality of columns each in the second direction (not shown). The second electrodes in each column are sequentially electrically coupled to form a second electrode string. The second electrodes in different columns are electrically insulated from each other. Each first electrode string in the first direction crosses each second electrode string in the second direction. In the present embodiment, the first direction is orthogonal to the second direction. In other embodiments of the present disclosure, the first direction may also intersect the second direction at other angles than the right angle. It can be understood that in other embodiments of the present disclosure, the plurality of first electrodes and the plurality of second electrodes may also be arranged in other manners.

In addition, the first electrode and the second electrode and their strings may also have other shapes and structures. For example, each first electrode may extend to be a strip in the first direction, all of the first electrodes are spaced apart from each other in the second direction. Each second electrode may extend to be a strip in the second direction and all of the second electrodes can be spaced apart from each other in the first direction.

In the present embodiment, the first electrodes and the second electrodes are transparent to allow light to pass therethrough. The first electrodes and the second electrodes may be made of indium tin oxide (ITO). In other embodiments of the present disclosure, the first electrode and the second electrode may be made of metal mesh, carbon nanotubes, or nano silver wires.

In the present embodiment, the first touch electrode layer 31 is located on a side of the polarizer 40 away from the covering layer 20; and the second touch electrode layer 32 is located on a side of the covering layer 20 adjacent to the polarizer 40. By arranging the first touch electrode layer 31 on the side of the polarizer 40 away from the covering layer 20, the touch sensing layer 30 can be closer to touch positions of the touch display device 100. The second touch electrode layer 32 is located on the side of the covering layer 20 adjacent to the polarizer 40, so that the second touch electrode layer 32 is far away from the display panel 10. Display signals to the display panel 10 have little interference on the second touch electrode layer 32.

Figure 3:
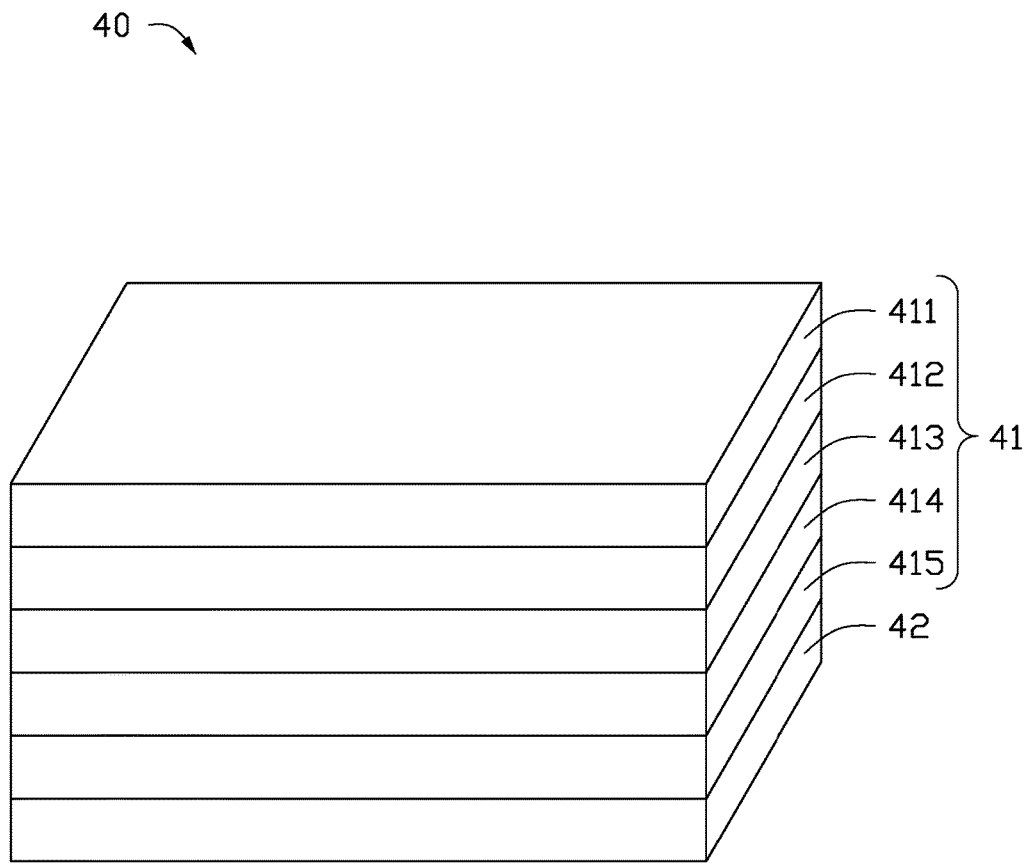
FIG. 3 is an isometric view of a polarizer of the device of FIG. 1.

In this embodiment, the polarizer 40 not only functions as a growth substrate of the first touch electrode layer 31, but also is configured for polarizing light or arbitrarily polarized light in a particular direction. FIG. 3 illustrates the polarizer 40 in FIG. 2. As shown in FIG. 3, the polarizer 40 includes a linear polarizer layer 41 and a quarter wave plate 42 below the linear polarizer layer 41. The linear polarizer layer 41 includes a protective film 411, a first triacetate cellulose (TAC) film 412, a polarizer film 413, a second triacetate cellulose film 414, an adhesive film 415, and a release film (not shown) stacked in that order along a thickness direction of the polarizer 40. The polarizer film 413 is used for polarizing light. The first TAC film 412 and the second TAC film 414 are configured to protect the polarizer film 413. When the linear polarizer layer 41 is attached to the quarter-wave plate 42, the release film is peeled off from the adhesive layer 415.

The polarizer film 413 may be made of polyvinyl alcohol (PVA) or other materials having a linear polarization function. The protective film 411, the adhesive layer 415, and the release film 416 are all made of materials commonly used in the field of polarizers, which are not described herein. The quarter-wave plate 42 may be made of polycarbonate (PC), triacetate cellulose (TAC), cast polypropylene (CPP), and other materials.

As shown in FIG. 2, the touch display device 100 further includes a cover glass 50 above the polarizer 40, particularly above the first touch electrode layer 31. An adhesive layer 60 is provided between the polarizer 40 and the glass cover 50, particularly between the polarizer 40 and the first touch electrode layer 31. Another adhesive layer 60 is provided between the polarizer 40 and the covering layer 20, particularly between the polarizer 40 and the second touch electrode layer 32. The two adhesive layers 60 are transparent, and the adhesive layer 60 may be made of, but is not limited to, an optically clear adhesive (OCA) or an optically clear resin (OCR) adhesive.

The polarizer 40 and one adhesive layer 60 are located between the first touch electrode layer 31 and the second touch electrode layer 32. Both the adhesive layer 60 and the polarizer 40 are electrically insulators, so that the first touch electrode layer 31 and the second touch electrode layer 32 are insulated from each other.

In this embodiment, the covering layer 20 is used to cover the display panel 10 so as to avoid humidification or oxidation of the display panel 10. The covering layer 20 may made of include $SiN_x$, $SiON$, $Al_2O_3$, and the like. In other embodiments, the covering layer 20 may be made of a polymer material.

In this embodiment, the first touch electrode layer 31 on the polarizer 40 may be made by forming a conductive layer (not shown) on the polarizer 40 by chemical vapor deposition (CVD) process, a sputtering process, a roll-to-roll process, or other low-temperature deposition processes and then patterning the conductive layer. The second touch electrode layer 32 on the covering layer 20 may be formed by forming a conductive layer (not shown) on the covering layer 20 by CVD process, a sputtering process, a roll-to-roll process, or other low-temperature deposition processes and then patterning the conductive layer.

As shown in FIG. 2, the display panel 10 is an OLED (organic light-emitting diode) display panel, which includes a substrate 11, and a driving layer 12 and a light-emitting element layer 13 on the substrate 11. The driving layer 12 is configured to control display function of the light-emitting element layer 13. The display panel 10 is not limited to OLED display panel, and can also be LCD panel or micro LED display panel.

In this embodiment, the light-emitting element layer 13 may be an OLED array layer including a plurality of OLEDs, and the driving layer 12 includes a thin film transistor (TFT) array. The light-emitting element layer 13 may include a lower electrode layer (not shown), an organic light-emitting layer (not shown), and an upper electrode layer (not shown) stacked on the substrate 11. The organic light-emitting layer may include an electron transporting layer (not shown), an organic material layer (not shown), a hole transporting layer (not shown), and a hole injection layer (not shown) stacked in that order. When different voltages are applied to the lower electrode layer and the upper electrode layer, the organic light emitting layer emits light.

As shown in FIG. 2, the display panel 10 further includes a frame 14 between the substrate 11 and the covering layer 20. The frame 14 is in the non-display area 102. The frame 14 surrounds the light-emitting element layer 13 and the driving layer 12 and encloses the light-emitting element layer 13 and the driving layer 12 between the substrate 11 and the covering layer 20. The driving layer 12 and the light-emitting element layer 13 are thus protected against moisture and oxidation.

Second Embodiment

Figure 4:
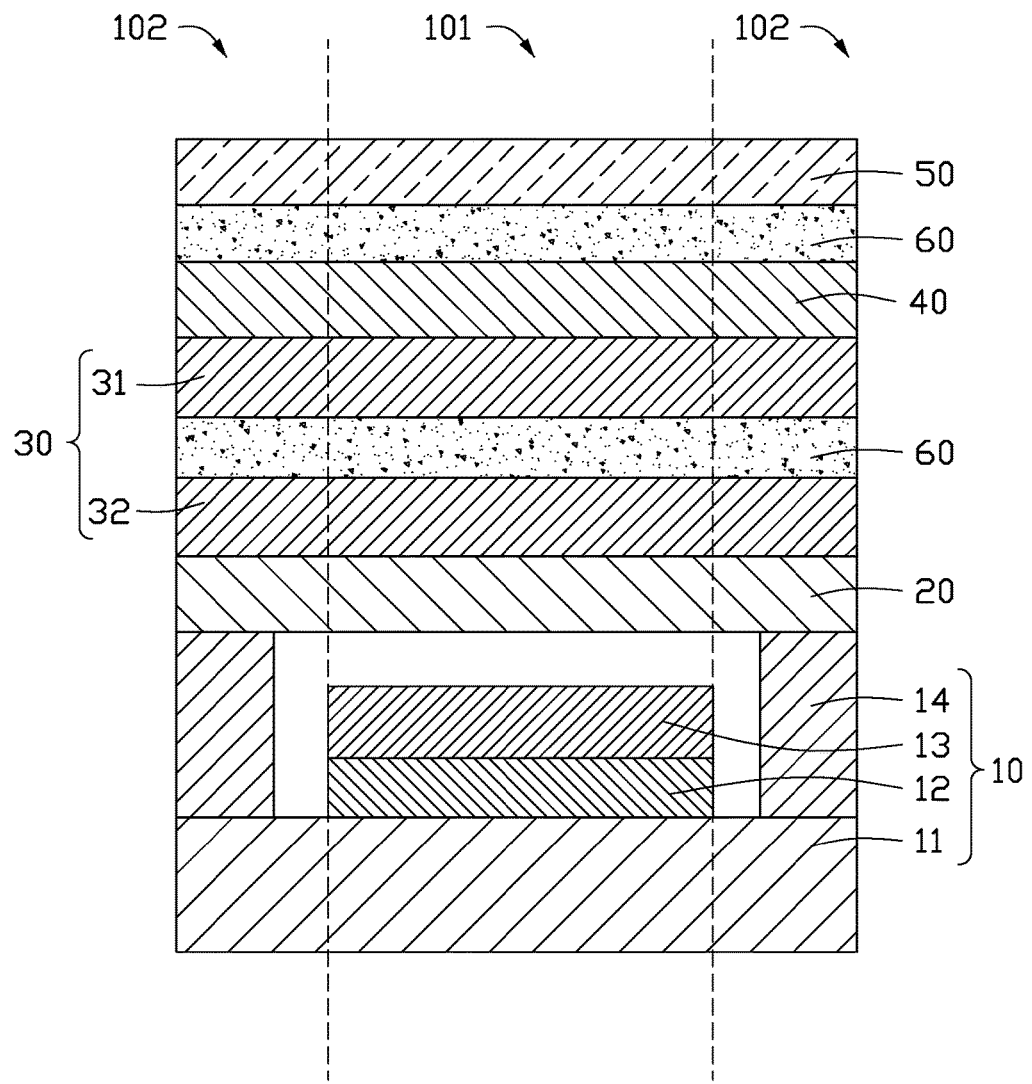
FIG. 4 is a cross-sectional view of a touch display device according to another embodiment of the present disclosure.

FIG. 4 illustrates a touch display device 200 according to a second embodiment of the present disclosure. The touch display device 200 is basically the same as the touch display device 100 of the first embodiment, but the positions of the first touch electrode layers 31 are different. In the first embodiment, the first touch electrode layer 31 is located on a side of the polarizer 40 away from the covering layer 20. In this embodiment, the first touch electrode layer 31 is located on a side of the polarizer 40 adjacent to the covering layer 20. An adhesive layer 60 is between the first touch electrode layer 31 and the second touch electrode layer 32. The adhesive layer 60 is electrically insulating so as to electrically insulate the first touch electrode layer 31 from the second touch electrode layer 32.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A touch display device comprising:
    a display panel;
    a covering layer on the display panel and configured for covering the display panel;
    a touch sensing layer on a side of covering layer away from the display panel, the touch sensing layer comprising a first touch electrode layer and a second touch electrode layer electrically insulated from the first touch electrode layer; and
    a polarizer on a side of covering layer away from the display panel;
    wherein the first touch electrode layer is on and in direct contact with the polarizer; the second touch electrode layer is on and in direct contact with the covering layer.

2. The touch display device of claim 1, wherein the first touch electrode layer is located on a side of the polarizer away from the covering layer.

3. The touch display device of claim 2, wherein the second touch electrode layer is located on a side of the covering layer adjacent to the polarizer; the polarizer is made of an electrically-insulating material.

4. The touch display device of claim 3, wherein an adhesive layer is between the polarizer and the second touch electrode layer; the adhesive layer is made of an electrically-insulating material.

5. The touch display device of claim 1, wherein the first touch electrode layer is located on a side of the polarizer adjacent to the covering layer.

6. The touch display device of claim 5, wherein the second touch electrode layer is located on a side of the covering layer adjacent to the polarizer.

7. The touch display device of claim 6, wherein an adhesive layer is between the first touch electrode layer and the second touch electrode layer; the adhesive layer is made of an electrically-insulating material.

8. The touch display device of claim 1, wherein the display panel is an OLED display panel; the display panel comprises a substrate, a driving layer and a light-emitting element layer on the substrate; the driving layer is between the substrate and the light-emitting element layer.

9. The touch display device of claim 8, wherein the driving layer comprises a thin film transistor array.

10. The touch display device of claim 8, further comprising a frame between the substrate and the covering layer; the frame surrounds the light-emitting element layer and the driving layer and encloses the light-emitting element layer and the driving layer between the substrate and the covering layer.

* * * * *